(12) United States Patent
Odani

(10) Patent No.: US 6,246,608 B1
(45) Date of Patent: Jun. 12, 2001

(54) NON-VOLATILE MEMORY CIRCUIT

(75) Inventor: Nobutsugu Odani, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/569,301

(22) Filed: May 11, 2000

(30) Foreign Application Priority Data

Jun. 3, 1999 (JP) .................................................. 11-156113

(51) Int. Cl.⁷ .................................................. G11C 16/06
(52) U.S. Cl. .................................. 365/185.2; 365/185.24; 365/185.29
(58) Field of Search ........................... 365/185.2, 185.24, 365/185.29

(56) References Cited

U.S. PATENT DOCUMENTS

| | | | |
|---|---|---|---|
| 5,892,714 | * | 4/1999 | Choi .................................. 365/185.24 |
| 6,026,015 | * | 2/2000 | Hirakawa ........................ 365/185.24 |
| 6,064,597 | * | 5/2000 | Takeshima et al. ............. 365/185.24 |

FOREIGN PATENT DOCUMENTS

| | | |
|---|---|---|
| 1-217796 | 8/1989 | (JP) . |
| 9-139092 | 5/1997 | (JP) . |

\* cited by examiner

*Primary Examiner*—Son T. Dinh
(74) *Attorney, Agent, or Firm*—Arent Fox Kintner Plotkin & Kahn, PLLC

(57) ABSTRACT

There is provided a non-volatile memory circuit which stores information by altering a threshold voltage of memory cells so as to associate first and second threshold voltages respectively with first and second data values, and which has a first recorded state and a second recorded state different from the first recorded state such that in the first recorded state, the first and second threshold voltages are lower or higher than a first reference voltage, and in the second recorded state, the first and second threshold voltages are lower or higher than a second reference voltage different from the first reference voltage. The first or second reference voltage is set in accordance with the first and second recorded states. With the above structure, in the first recorded state, the first and second threshold voltages are either lower or higher than the first reference voltage within a voltage range lower or higher than the second reference voltage. At the time of transition to the second recorded state from the first recorded state, the use of the second reference voltage renders all of those cell transistors which have been in the first recorded state to have a threshold voltage lower or higher than the second reference voltage so that an erasing operation has virtually been carried out with respect to the second reference voltage. As the erasing operation is implemented merely by changing the reference voltage, it needs less time and less power consumption.

3 Claims, 14 Drawing Sheets

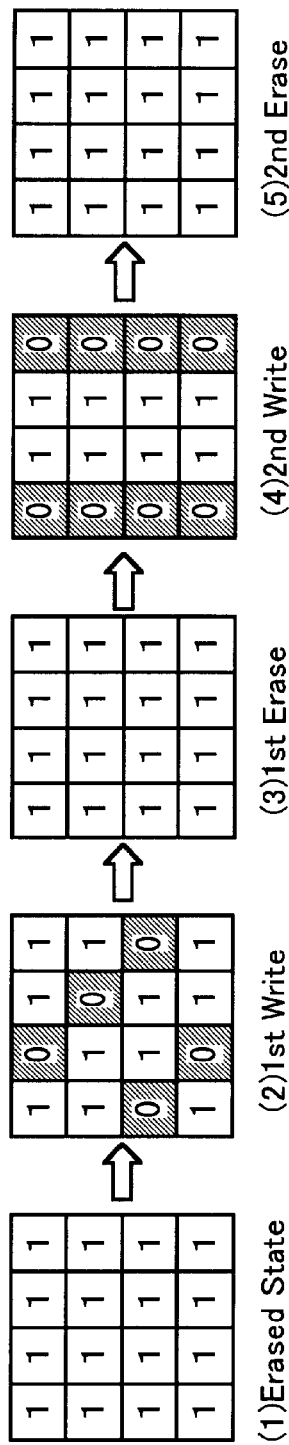
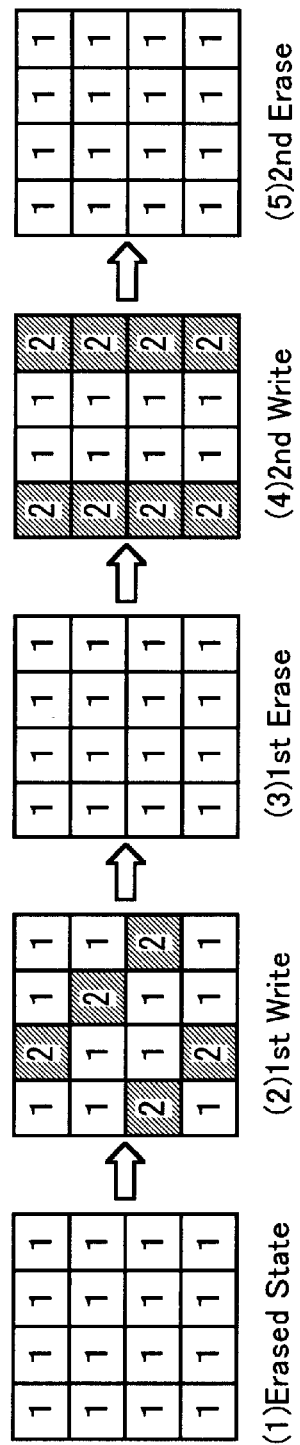
FIG. 2A Data
FIG. 2B Vth
1 = Vth1
2 = Vth2 (>Vth1)

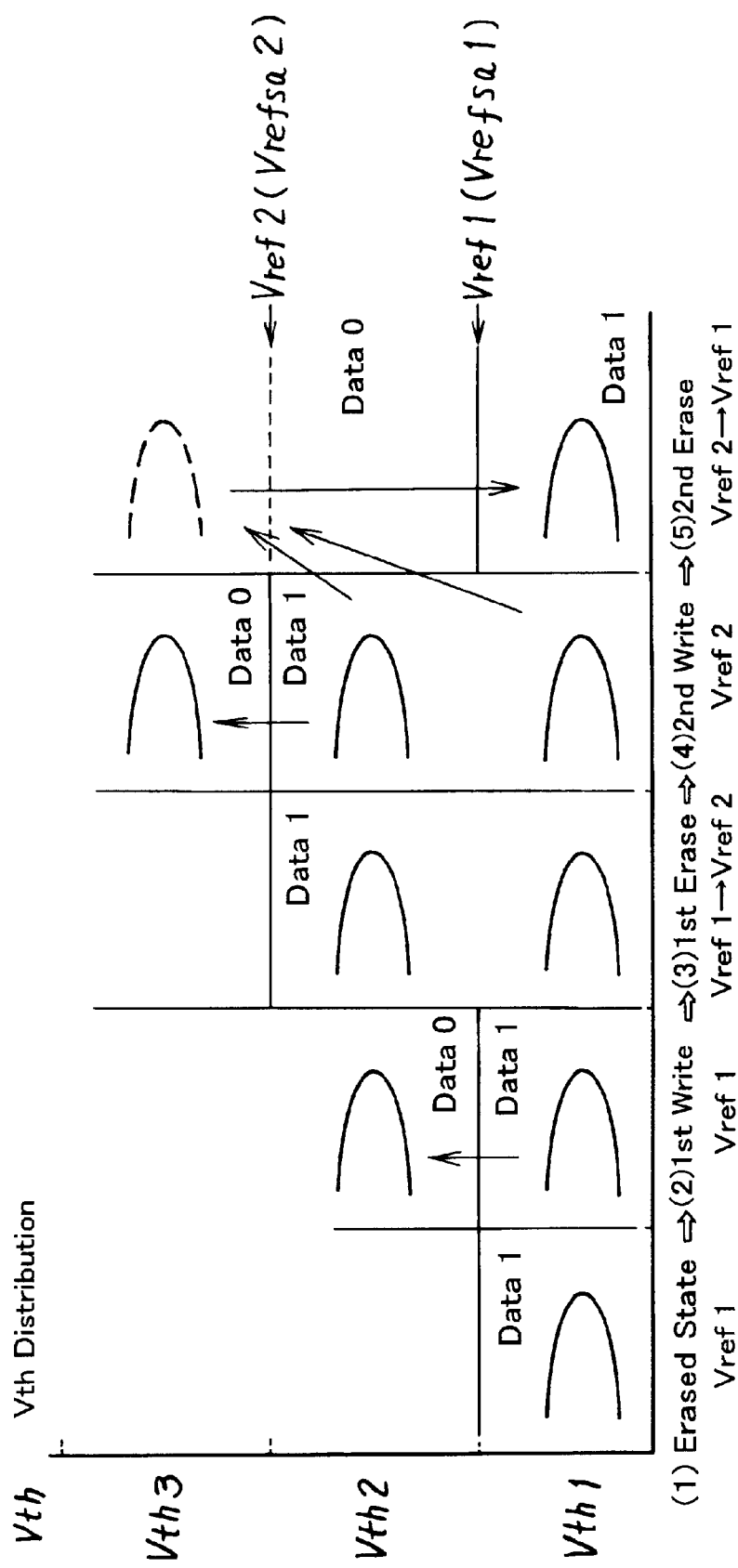

Data

Vth

1=Vth1
2=Vth2
3=Vth3

Second Embodiment

Third Embodiment

Fourth Embodiment

NON-VOLATILE MEMORY CIRCUIT

BACKGROUND OF THE INVENTION

1. Field of the Invention

The present invention relates to a non-volatile memory circuit and, more particularly, to a non-volatile memory circuit capable of shortening the erasure time for a flash memory which uses memory cells having floating gates.

2. Related Art

A flash memory or non-volatile memory which uses memory cells having floating gates can retain recorded information even when it is powered off and has a faster reading speed than a hard disk or the like. In programming (or writing) memory cells having floating gates, for example, charges are injected into the floating gates to raise the threshold voltages of cell transistors, thereby recording data "0". In an erasing operation, charges are drawn out of the floating gates to reduce the threshold voltage of cell transistors, causing data "1" to be recorded.

The injection and drawing of charges into and out of the floating gates needs a specific time so that changing data takes time if such charge injection and drawing are performed cell by cell. To cope with this shortcoming, in program mode, the conventional memory circuits temporarily render all the memory cells in an erased state which is data "1", then inject charges only to desired or target memory cells to write data "0" there. In the erasing operation, charges are temporarily injected to all the memory cells of data "1" to make all of their threshold voltages in a high state (preprogram) and an erase voltage is simultaneously applied to all the memory cells to render them in a state of data "1" (collective erasure).

As apparent from the above, a flash memory or nonvolatile memory which uses memory cells having floating gates stores given information by changing the state of the target memory cells to data "0" from data "1" in program mode, and preprograms and collectively and simultaneously erase all the memory cells to a state of data "1" in erasing mode.

FIG. 1 is a schematic operational chart of a conventional memory; the horizontal scale represents the number of cells and the vertical scale threshold levels (threshold voltages) and data "1" and "0" of cell transistors. Shown horizontally are (1) erased state (initial state), (2) first writing, (3) first erasing, (4) second writing and (5) second erasing.

The diagram shows a reference voltage (Vref) for writing and erasure. In an ordinary memory circuit, a sense amplifier compares the output voltage corresponding to a cell transistor with the reference voltage. When the threshold voltage of a cell transistor is higher, the cell transistor has a small current value and provides a high output voltage, and when the threshold voltage of the cell transistor is lower, the cell transistor has a large current value and provides a low output voltage. The comparison of the threshold voltage with the reference voltage for the sense amplifier should actually be discussed in connection with the output voltage. As the high/low state of the threshold voltage of each cell transistor corresponds one to one to the high/low state of the output voltage, however, the reference voltage Vref in the cell is used as the reference voltage corresponding to the threshold voltage in the following explanation of this specification. Therefore, changing the setting of the reference voltage in a cell is the same as changing the setting of the reference voltage for the sense amplifier. It is to be noted however that while the high/low states of both reference voltages correspond to each other, their absolute values may differ from each other in some cases.

FIGS. 2A and 2B are diagrams illustrating the transition of data and threshold levels (threshold voltages) of a 4×4 memory cell array in accordance with the operations in FIG. 1. FIG. 2A shows the transition of data, and FIG. 2B the transition of the threshold levels of cell transistors. The numerals "0" and "1" in the individual cells in FIG. 2A respectively indicate data "0" and "1", and the numerals "0" and "1" in the individual cells in FIG. 2B respectively indicate a low threshold level Vth1 and a high threshold level Vth2.

In the initial state (1), the threshold levels of all the cell transistors are the low level vth1, so that data of all the cell transistors are "1". In the first writing, charges are injected to the floating gates of the target memory cells to set their threshold levels to the high level Vth2. Accordingly, some of the cells are in the state of the high threshold level Vth2 (data "0"), while the other cells are in the state of the low threshold level Vth1 (data "1").

To implement the second writing (4), erasure is carried out temporarily. That is, in this first erasing (3), those cells which have had the low threshold level Vth1 in the aforementioned state (2) are individually preprogrammed to all have the high threshold level Vth2. Then, the erase voltage is simultaneously applied to all the memory cells to draw the charges from the floating gates, rendering all the cell transistors to have the low threshold level Vth1 (data "1"). In this situation, the second writing (4) is performed to apply a write voltage to target cell transistors to inject charges to their floating gates so that those cell transistors of target memory cells to set their have the high threshold level Vth2 (data "0").

Thereafter, when data rewriting becomes necessary again, the second erasing (5) is executed in the same manner discussed above to render all the cell transistors to have the low threshold level Vth1 (data "1").

The conventional non-volatile memories need to erase all the cell transistors or all the cell transistors in a given sector, every time data is to be rewritten. This erasing operation involves preprogramming and simultaneous erasure and thus takes time. It is undesirable to implement such long and power-consuming erasure every time data is to be rewritten. To rewrite image data in a digital camera, for example, such an erasing operation takes time and suffers increased power consumption.

SUMMARY OF THE INVENTION

Accordingly, it is an object of the present invention to provide a non-volatile memory circuit which is free of the conventional problem.

It is another object of this invention to provide a non-volatile memory circuit which performs a simpler erasing operation at the time of data rewriting.

It is a further object of this invention to provide a non-volatile memory circuit which can quickly carry out an erasing operation at the time of data rewriting.

It is a still further object of this invention to provide a non-volatile memory circuit which can reduce power consumption needed in an erasing operation at the time of data rewriting.

To achieve the above objects, according to one aspect of this invention, there is provided a non-volatile memory circuit which stores information by altering a threshold voltage of memory cells so as to associate first and second threshold voltages respectively with first and second data values, and which has a first recorded state and a second recorded state different from the first recorded state such that in the first recorded state, the first and second threshold voltages are lower or higher than a first reference voltage, and in the second recorded state, the first and second threshold voltages are lower or higher than a second reference voltage different from the first reference voltage. The first or second reference voltage is set in accordance with the first and second recorded states.

With the above structure, in the first recorded state, the first and second threshold voltages are either lower or higher than the first reference voltage within a voltage range lower or higher than the second reference voltage. At the time of transition to the second recorded state from the first recorded state, the use of the second reference voltage renders all of those cell transistors which have been in the first recorded state to have a threshold voltage lower or higher than the second reference voltage so that an erasing operation has virtually been carried out with respect to the second reference voltage. As the erasing operation is implemented merely by changing the reference voltage, it needs less time and less power consumption.

The above setting of the reference voltage is normally achieved by setting the reference voltage for the sense amplifier as the reference voltage in a cell corresponds to the threshold voltage of the sense amplifier.

According to another aspect of this invention, there are three or more recorded states.

BRIEF DESCRIPTION OF THE DRAWINGS

FIGS. 2A and 2B are diagrams illustrating the transition of data and threshold levels (threshold voltages) of a 4×4 memory cell array in accordance with the operations in FIG. 1;

FIG. 3 is a schematic operational chart of a memory circuit according to one embodiment of this invention;

DETAILED DESCRIPTION OF THE PREFERRED EMBODIMENTS

Preferred embodiments of the present invention will now be described with reference to the accompanying drawings. Those embodiments are to be considered as illustrative and not restrictive and the scope of the invention is not in any way to be limited to the details given herein.

Figure 1:
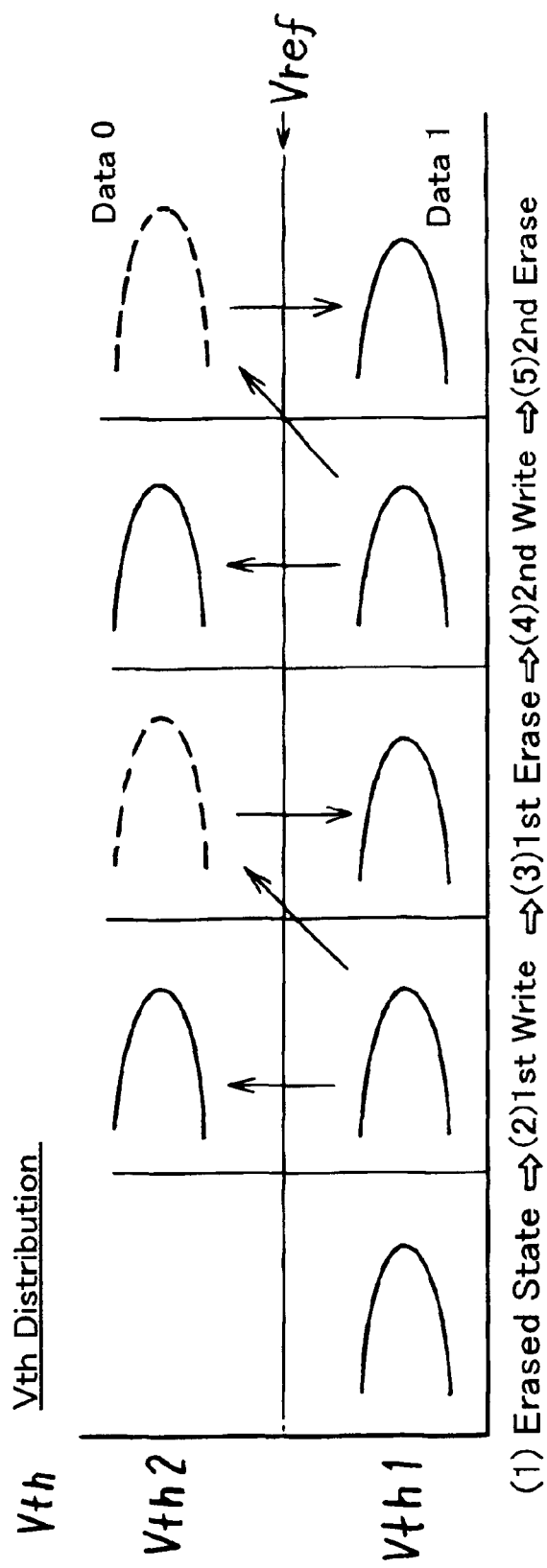
FIG. 1 is a schematic operational chart of a conventional memory.
Figure 4A:
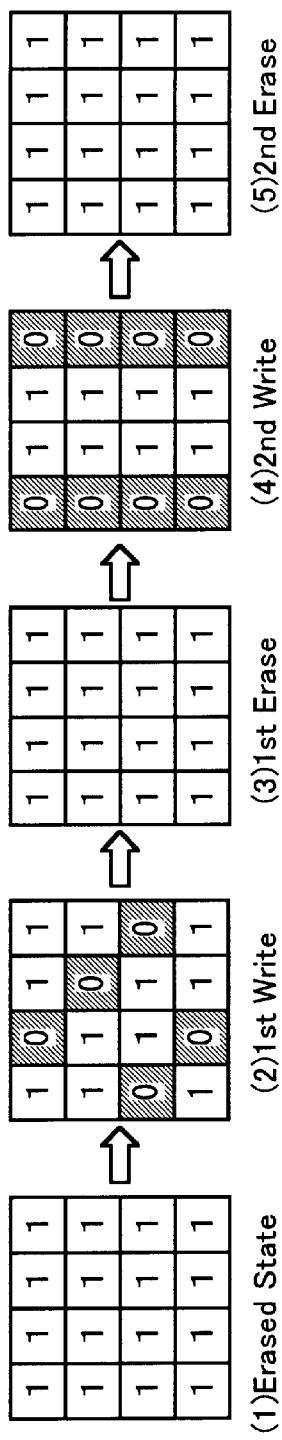
FIGS. 4A and 4B are diagrams illustrating the transition of data and threshold levels (threshold voltages) of a 4×4 memory cell array in accordance with the operations in FIG. 3.
Figure 4B:
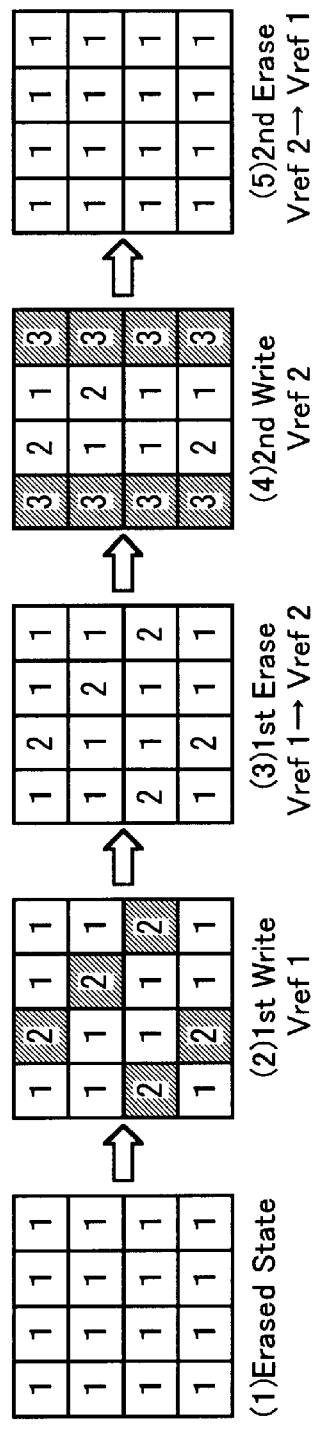

FIG. 3 is a schematic operational chart of a memory circuit according to one embodiment of this invention. FIGS. 4A and 4B are diagrams illustrating the transition of data "0" or "1") and threshold voltages (Vth1 to Vth3 respectively indicated by "1" to "3") of a 4×4 memory cell array in accordance with the operations in FIG. 3. The horizontal scale and vertical scale of FIG. 3 are the same as those of FIG. 1 showing the prior art, and the operations in FIG. 3 are likewise the same as those in FIG. 1. FIG. 4A shows the transition of data in each memory cell, and FIG. 4B the transition of the threshold levels (threshold voltage) of each memory cell.

The reference voltages Vref1 and Vref2 illustrated in those diagrams, like those discussed in the section of the prior art, are voltages derived by associating the reference voltage Vrefsa for a sense amplifier, discussed later, with the threshold voltages of each cell transistor.

The embodiment of FIG. 3 has a first recorded state ((1) (2) (5) in the diagram) and a second recorded state ((3) (4) in the diagram) such that every time data is rewritten, the recorded state is changed from the first recorded state to the second recorded state, and is further changed to the first recorded state. To make that change, the reference voltage Vref in a cell (hereinafter called "intra-cell reference voltage") is merely changed from the first reference voltage Vref1 to the second reference voltage Vref2 or vice versa. That is, the level of the corresponding reference voltage for the sense amplifier is changed from the first level Vrefsa1 to the second level Vrefsa2 or vice versa.

The states (1) to (5) in FIGS. 3 and 4 will now be discussed one by one. In the first erased state (1), the threshold voltages of all the cell transistors are Vth1 lower than the first reference voltage Vref1. In this state which is the first recorded state, as the threshold voltages Vth1 of all the cell transistors are lower than the first reference voltage Vref1, data "1" is recorded in all the cells to initialize the cells.

In the first writing operation for writing a group of given data in this initial erased state (1), the threshold voltages of those cell transistors where data "0" is to be written are changed to the threshold level Vth2 higher than the first reference voltage Vref1. To accomplish this operation, a write voltage to be discussed later is applied to the cell transistors to inject charges to the floating gates. As a result, in the state (2) after the first writing, the threshold level Vth1 of some cell transistors is still lower than the first reference voltage Vref1, and the threshold level Vth2 of the other cell transistors becomes higher than the first reference voltage Vref1.

In other words, those hatched cells in FIG. 4B has the threshold voltage Vth2 which means that data "0" has been written. In this first recorded state (1) (2), cell data "1" and "0" can be read by using the first reference voltage Vref1.

To write a group of data different from the recorded data (second writing), the first erasing (3) should be performed, followed by the second writing (4). In the conventional erasing operation, preprogramming is performed to set all the data to "0" and the erase voltage is simultaneously applied to all the cell transistors to lower their threshold voltages. By way of contrast, this embodiment simply requires that the intra-cell reference voltage be changed to the second reference voltage Vref2 from the first reference voltage Vref1 in the first erasing (3). That is, the level of the corresponding reference voltage for the sense amplifier is changed to the second level Vrefsa2 from the first level Vrefsa1.

As apparent from FIG. 3, because the second reference voltage Vref2 is higher than the threshold voltages Vth1 and Vth2 of all the cell transistors in the first written state (2), changing the reference voltage in the way discussed above renders all the cells in the state of data "1" or an erased state. Therefore, this embodiment can execute the first erasing operation faster and with lower power consumption than the conventional erasing operation which preprograms the cell transistors and then simultaneously erases all the memory cells.

To carry out the second writing (4) in the first erased state (3), the write voltage is applied to the cell transistors where data Hots is to be written so as to inject charges to the floating gates so that their threshold voltages are set to the voltage Vth3 higher than the second reference voltage Vref2. As a result, data "0" can be distinguished from data "1" by using the second reference voltage Vref2. This state is the second recorded state. That is, in the state (4), data "0" is recorded in the hatched cells whose threshold voltages are now Vth3, as shown in FIG. 4A.

To perform the third writing, the second erasing (5) should be carried out. According to this embodiment, the second erasing is accomplished by executing preprogramming to set all the threshold voltages of those cell transistors which have data "1" recorded therein higher than the second reference voltage Vref2, and then applying the erase voltage to all the cell transistors to make the threshold voltages lower than the first reference voltage Vref1. That is, this second erasing operation involves a preprogramming operation and simultaneous erasure as per the prior art, and thus takes about the same time as the prior art does.

The state (5) is the same as the initial erased state (1),and subsequent writing and erasing operations are accomplished by repeating the above-described states (1) to (5). According to this embodiment, therefore, an odd erasing operation merely requires changing of the reference voltage and is implemented quickly and with less power consumption. But, an even erasing operation should execute both preprogramming and simultaneous erasure. It is to be noted however that the average erasure time becomes shorter and the average consumed power becomes lower.

Figure 5:
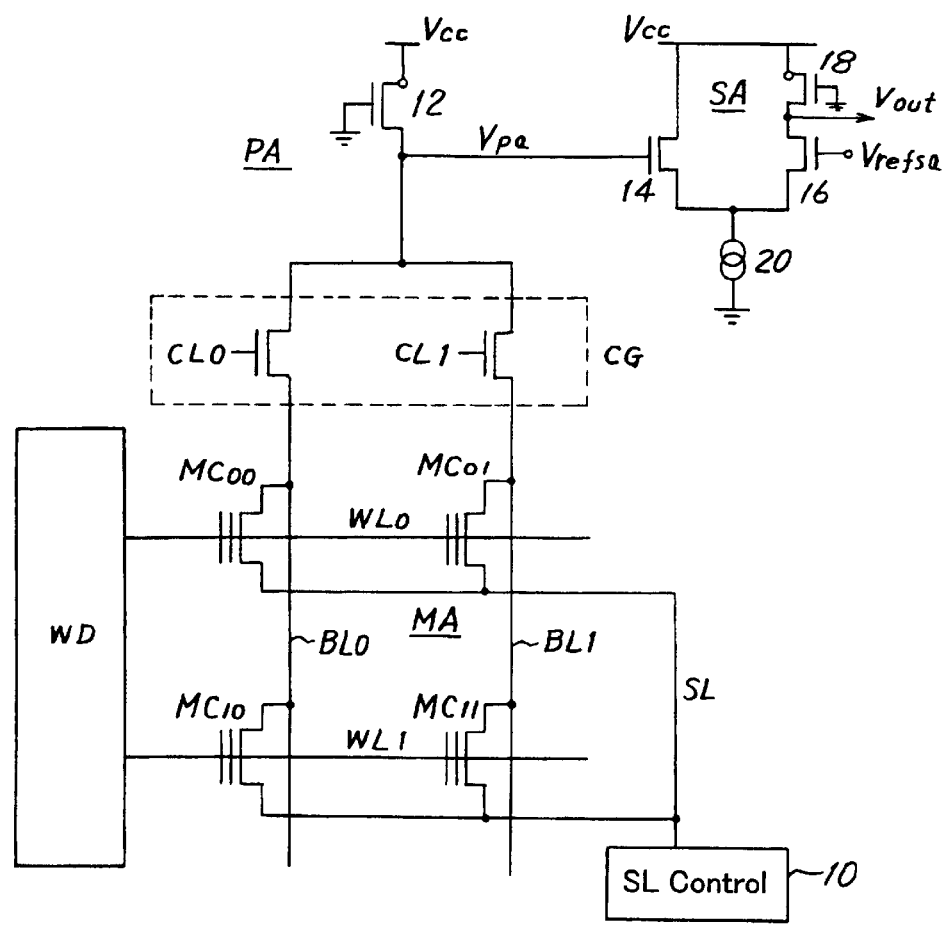
FIG. 5 is a circuit diagram showing a memory cell array and a sense amplifier in the memory circuit according to this embodiment.

FIG. 5 is a circuit diagram showing the memory cell array and the sense amplifier in the memory circuit according to this embodiment. Referring to FIG. 5, 2×2 memory cells MC00 to MC11 are located at the intersections of word lines WL0 and WL1 and bit lines BL0 and BL1. Each memory cell is an N-channel transistor which has a floating gate and a control gate connected to the associated word line WL and has a drain connected to the associated bit line BL and a source connected a common source line SL.

The word lines WL are driven by a word driver WD, and the bit lines BL are connected via a column gate CG to a preamplifier PA. Column select signals CL0 and CL1 from an unillustrated column decoder are supplied the gates of the individual transistors in the column gate CG to conduct a single column gate transistor. The voltages of source lines SL are controlled by a source line controller 10.

The preamplifier PA is an amplifier circuit which comprises a P-channel transistor 12 having a source connected to a power supply Vcc and a gate connected to the ground and a selected memory cell transistor. The P-channel transistor 12 works as a load circuit. The output Vpa of the preamplifier PA is supplied to a sense amplifier SA, which comprises N-channel transistors 14 and 16 having their sources connected commonly, a P-channel transistor 18 serving as a load circuit, and a current supply 20. The output Vpa of the preamplifier PA is supplied to the gate of the transistor 14, and the reference voltage Vrefsa for the sense amplifier to the gate of the transistor 16. An output voltage Vout is acquired from, for example, the drain terminal of the transistor 16.

Figure 6:
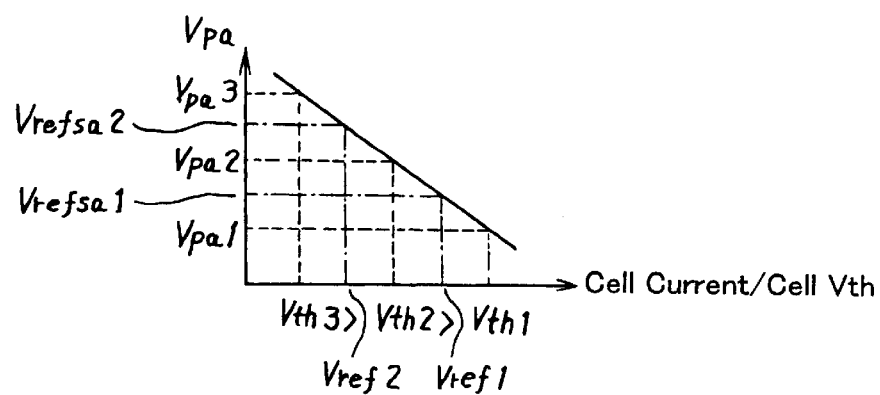
FIG. 6 is a characteristic diagram of a preamplifier PA in this embodiment.

FIG. 6 is a characteristic diagram of the preamplifier PA in this embodiment. The horizontal scale represents the cell current or the threshold voltage Vth of a memory cell and the vertical scale the output Vpa of the preamplifier PA. The threshold voltage on the horizontal scale gets lower in the direction of the arrow. On the other hand, the cell current becomes larger in the arrow direction.

As shown in FIG. 6, when the threshold voltage of a memory cell MC is at the low level vth1, the cell current becomes larger for the same word line voltage. Consequently, the output Vpa1 of the preamplifier PA which is constituted by the memory cell MC and the load circuit 12 becomes lower. When the threshold voltage of the memory cell MC has the level Vth2 higher than the low level vth1, the cell current gets lower, making the output Vpa2 of the preamplifier PA higher. When the level of the threshold voltage of the memory cell MC becomes the level Vth3 higher than the threshold level Vth2, the output Vpa3 of the preamplifier PA becomes higher.

Those outputs Vpa of the preamplifier PA are compared with the reference voltage Vrefsa in the sense amplifier SA. Therefore, the sense amplifier SA needs Vrefsa1 and Vrefsa2 as the reference voltage Vrefsa therefor in order to detect the preamplifier outputs Vpa1, Vpa2 and Vpa3 shown in FIG. 6.

As apparent from the above, an increase/decrease in the threshold voltage Vth of the transistor in each memory cell corresponds to an increase/decrease in the output voltage Vpa of the preamplifier PA. The high/low relationship of the reference voltages Vref1 and Vref2 for cells with respect to the threshold voltage Vth of the cell transistors corresponds one to one to the high/low relationship of the reference voltages Vrefsa1 and Vrefsa2 for the sense amplifier. In this specification, therefore, changing the setting of the reference voltage for the sense amplifier means equivalent to changing the setting of the intra-cell reference voltage for the sake of convenience.

Figure 7:
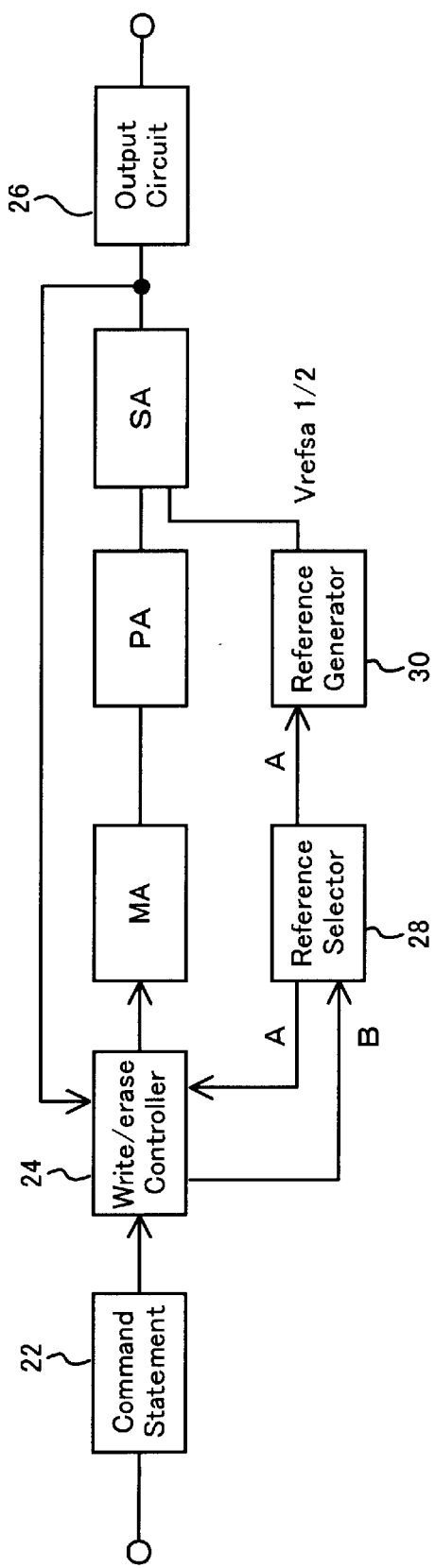
FIG. 7 is a general structural diagram of the memory circuit according to this embodiment.

FIG. 7 is a general structural diagram of the memory circuit according to this embodiment. A command statement circuit 22 is externally supplied with a command for reading, programming, erasing, or the like, decodes the command and sends a necessary internal command signal to a write/erase controller 24. In response to the internal command signal, the write/erase controller 24 controls the voltages on the word lines, bit lines and source lines in the memory cell array MA.

The memory cell array MA is connected, as mentioned earlier, to the preamplifier PA which is further connected to the sense amplifier SA. The output of the sense amplifier SA is sent out from an output circuit 26. The sense amplifier SA is supplied with the reference voltage Vrefsa for the sense amplifier which is generated by a reference selector 28 and a reference generator 30. The reference selector 28 has recording means for recording the current recorded state in accordance with which the reference generator 30 generates the corresponding reference voltage Vrefsa for the sense amplifier SA. In the next writing or erasing operation, the write/erase controller 24 changes the recorded state held in the reference selector 28 according to the held state.

Figure 8:
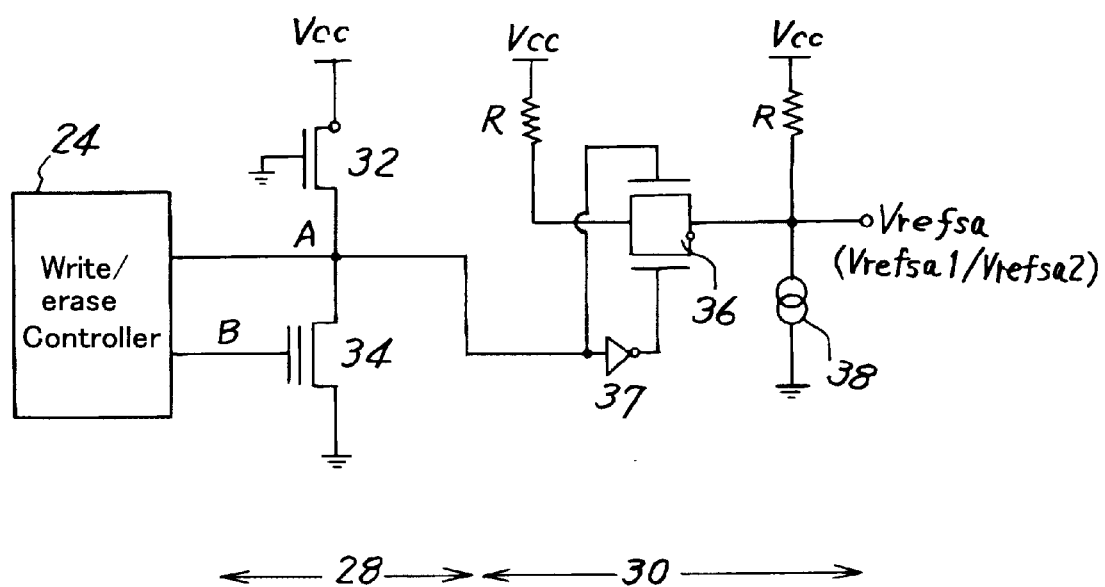
FIG. 8 is a circuit diagram depicting a reference selector and a reference generator.

FIG. 8 is a circuit diagram depicting the reference selector and the reference generator. The reference selector 28 comprises a P-channel transistor 32 and a transistor 34 which has the same structure as a cell transistor and retains the recorded state. The recording transistor 34 has a source connected to the ground and a control gate connected to the write/erase controller 24. As a write pulse or erase pulse is supplied to a node B from the write/erase controller 24, the threshold voltage of the recording transistor 34 is changed. For instance, a high write pulse is applied to the node B to inject charges to the floating gate of the transistor 24 to thereby increase the threshold voltage, and a low (negative) erase pulse is applied to the node B to draw charges from the floating gate of the transistor 34, thereby lowering the threshold voltage.

According to this embodiment, the threshold voltage of the transistor 34 is lowered to set the first recorded state in which the voltage at a node A is low. The second recorded state is set by increasing the threshold voltage of the transistor 34. In this state, the voltage at the node A is high.

The reference generator 30 comprises two resistors R, a CMOS transfer gate 36, an inverter 37 and a current source 38. In the first recorded state, the voltage at the node A is low so that the transfer gate 36 is rendered off. As a result, there is one load resistor R in the reference generator 30 and the reference voltage Vrefsa for the sense amplifier becomes the low, first level Vrefsa1. In the second recorded state, the voltage at the node A is high so that the transfer gate 36 is rendered on. Consequently, there is a parallel circuit of two load resistors R in the reference generator 30 and the reference voltage Vrefsa for the sense amplifier becomes the high, second level Vrefsa2.

Figure 9:
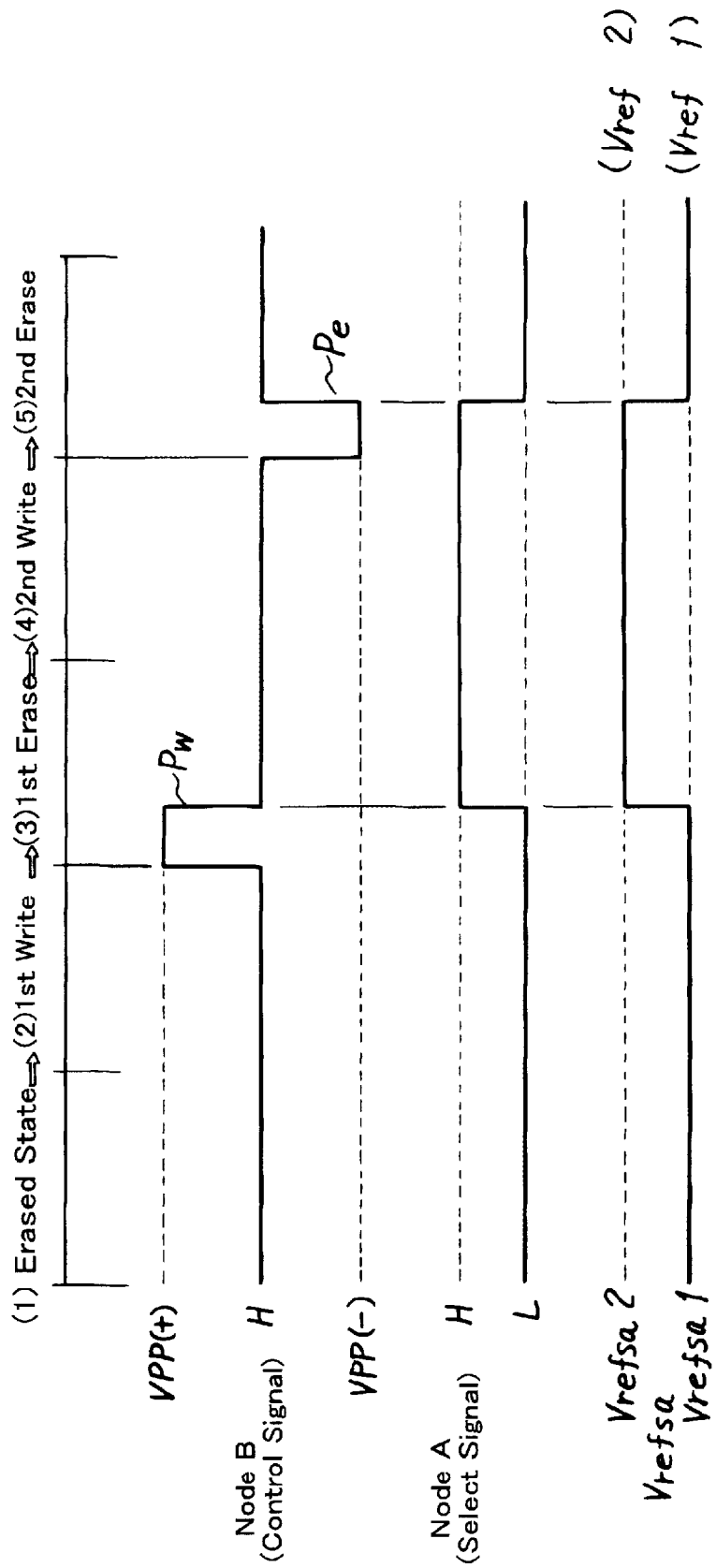
FIG. 9 is a diagram illustrating the operations of the reference selector and reference generator.

FIG. 9 is a diagram illustrating the operations of the reference selector 28 and reference generator 30. FIG. 9 shows changes in voltages at the nodes A and B in the reference selector 28 and the reference voltage Vrefsa for the sense amplifier or the output of the reference generator 30 in (1) the initial erased state, (2) the first writing, (3) the first erasing, (4) the second writing and (5) the second erasing as illustrated in FIGS. 3 and 4.

In the initial erased state (1), the threshold voltage of the transistor 34 is low so that when the read voltage of an H level is applied to the node B, the potential at the node A or the select signal has an L level. Therefore, the reference voltage Vrefsa for the sense amplifier to be generated is kept at the low, first level Vrefsa1. That is, the first recorded state is set.

To execute the first writing (2) under this situation, programming (writing) of target memory cells in the memory cell array MA is performed, making the threshold voltages of their cell transistors to the second threshold voltage Vth2 higher than the intra-cell reference voltage Vref1 so that data "0" is written. A program verify operation in this writing operation is performed by using the first reference voltage Vrefsa1 for the sense amplifier. In the first recorded state, cell information is read using the first reference voltage Vrefsa1 for the sense amplifier.

To write another information in the memory cell array, all the cell transistors should temporarily be erased to hold data "1". According to this embodiment, in the first erasing (3), the write/erase controller 24 applies a write pulse Pw to the node B to inject charges to the floating gate of the transistor 34, thereby increasing the threshold voltage. This write pulse Pw has the same high voltage level Vpp as the normal write voltage to the cell transistors. Consequently, the level of the potential at the node A, the select signal, becomes an H level, causing the reference voltage Vrefsa for the sense amplifier to be changed to the second level Vrefsa2. As a result of the change to the second reference voltage Vrefsa2 for the sense amplifier, information in every cell which has been in the first recorded state becomes data "1", so that erasing of all the cell transistors in the memory cell array has virtually been carried out. What is more, the erasing operation just involves an operation of injecting charges to the transistor 34 in the reference selector 28, resulting in a shorter operation time and lower power consumption.

In the second recorded state, the second writing (4) is performed. In this writing operation, the second reference voltage Vrefsa2 for the sense amplifier is supplied to the sense amplifier SA and a programming pulse is applied to desired or target cell transistors, causing charges to be injected to their floating gates. The program verify operation is executed using the second reference voltage Vrefsa2 for the sense amplifier and the application of the programming pulse continues until the output Vout of the sense amplifier SA is inverted. As a result, the threshold voltages Vth of the target cell transistors become the third threshold voltage Vth3 higher than the second intra-cell reference voltage Vref2, causing data "0" to be written (programmed). A reading operation thereafter is carried out also by using the second reference voltage Vrefsa2 for the sense amplifier.

When data rewriting becomes necessary again, the second erasing operation (5) is performed. In this case, the write/erase controller 24 detects the level of the potential at the node A in the reference selector 28, the select signal, and detects that the second recorded state is set. In this case, the write/erase controller 24 performs a writing operation on those cell transistors in the memory cell array MA which have data "1" and sets their threshold voltages higher than the second intra-cell reference voltage Vref2. This is a preprogramming operation. Thereafter, the erase pulse Pe is applied to the node B to set the threshold voltage of the transistor 34 lower, setting the reference voltage Vrefsa for the sense amplifier to the first level Vrefsa1. Based on this first level Vrefsa1, the erase pulse is applied to all the cell transistors, thereby rendering their threshold voltages lower than the first reference voltage Vref1. Accordingly, the threshold voltages of all the cell transistors become the first level Vth1 so that those cell transistors all have data "1". Consequently, the first recorded state is set.

Figure 10:
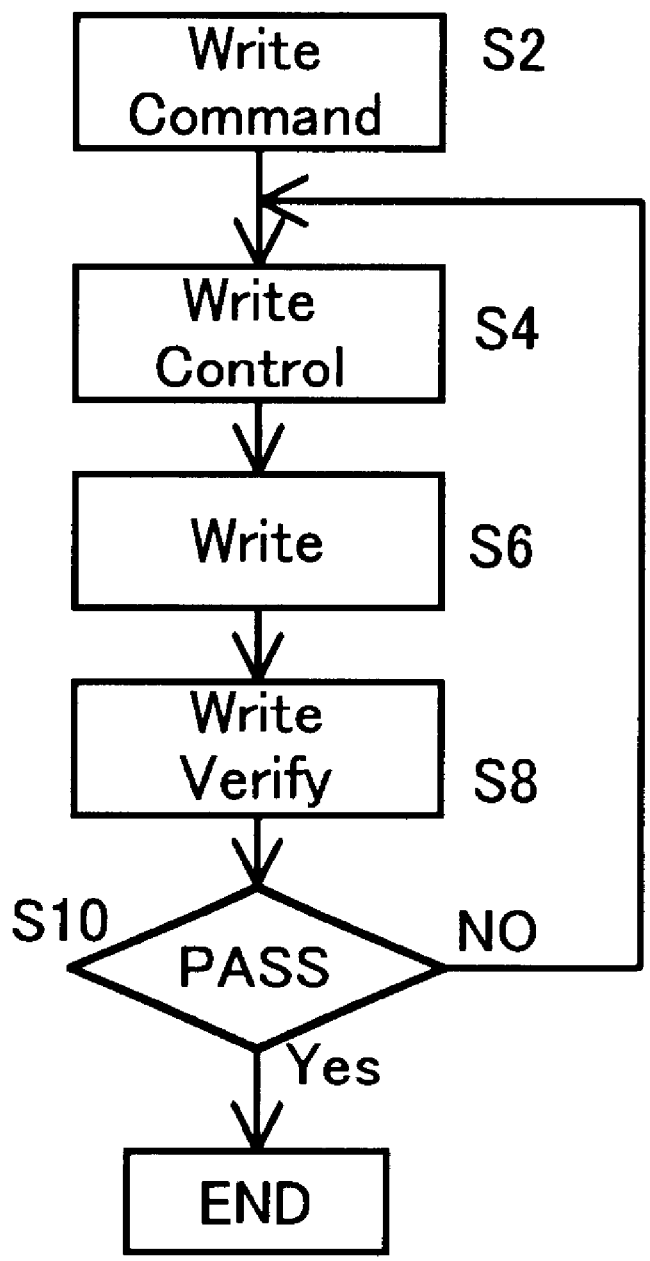
FIG. 10 is a flowchart for explaining the internal operation of the memory circuit in response to a write command.

FIG. 10 is a flowchart for explaining the internal operation of the memory circuit in response to a write command. When the write command is supplied to the command statement circuit 22 shown in FIG. 7 (S2), the write/erase controller 24 performs writing control on the memory cell array MA (S4). Specifically, the writing control set the potentials of the source lines SL to the ground level and the potentials of the bit lines BL to an H level and makes the word lines WL ready to be applied with the write pulse of the high potential Vpp.

Then, the write/erase controller 24 applies the write pulse to target memory cells to execute a writing operation (S6). After the write pulse is applied for a predetermined period of time, the output Vpa of the preamplifier PA is compared with the set reference voltage Vrefsa for the sense amplifier by the sense amplifier SA to perform program verify (write verify) to check if the threshold voltages of the cell transistors exceed the reference voltage Vref. The above-described operation is repeated until all the cell transistors where data "0" should be written are verified to have met the condition in the program verify.

Figure 11:
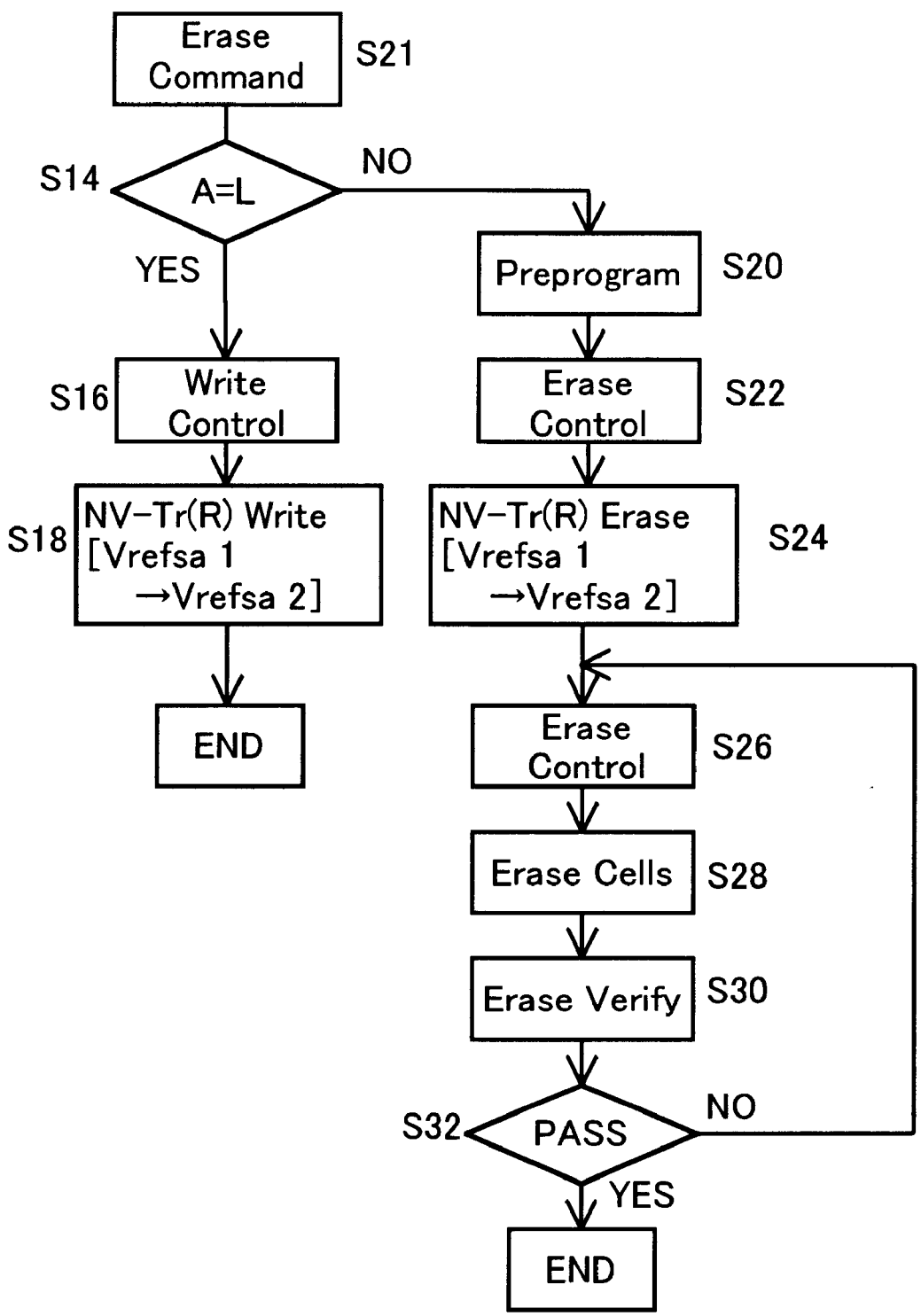
FIG. 11 is a flowchart for explaining the internal operation of the memory circuit in response to an erase command.

FIG. 11 is a flowchart for explaining the internal operation of the memory circuit in response to an erase command. When the erase command is supplied to the command statement circuit 22 (S12), the write/erase controller 24 first checks the level of the potential at the node A in the reference selector 28 or the select signal (S14).

When the potential at the node A has an L level, which is the first recorded state, the erasing operation at this time just involves writing to the transistor 34 in the reference selector 28. Therefore, the write/erase controller 24 performs writing control on the transistor 34 (S16) to apply the write pulse Pw to the node B of the transistor 34, thereby increasing the threshold voltage. Consequently, the reference voltage Vrefsa for the sense amplifier which is generated by the reference generator 30 is switched to the second level Vrefsa2 (S18). As a result, all the cell transistors are rendered in the state where data "1" is written, virtually yielding an all-erased state. Accordingly, the second recorded state is set.

When the potential at the node A has an H level which is the second recorded state, on the other hand, the erasing operation at this time involves preprogramming to temporarily program all the cells to have data "0", then applying the erase pulse to the entire cell transistors and execution of erase verify. That is, the preprogramming operation (S20), which is similar to the writing operation in FIG. 10, writes data "0" to those memory cells holding data "1".

Next, the write/erase controller 24 carries out erasure control (S22). The write/erase controller 24 applies the erase pulse Pe to the transistor 34 in the reference selector 28 to reduce the threshold voltage of that transistor, thereby setting the potential at the node A to an L level. As a result, the reference voltage for the sense amplifier becomes the first reference voltage Vrefsa1. The write/erase controller 24 further performs erasure control on the memory cell array MA (S26). Specifically, the write/erase controller 24 renders the bit lines BL in a floating state and the common source line SL to the level Vcc and makes the word lines WL ready to be applied with a negative erase pulse. In the memory erasing operation, actually, the write/erase controller 24 simultaneously applies the negative erase pulse to all the cell transistors for a predetermined period of time (S28).

After the application of the negative erase pulse for the predetermined period of time, the output Vpa of the preamplifier PA is compared with the set second reference voltage Vrefsa1 for the sense amplifier by the sense amplifier SA to perform erase verify to check if the output Vout has the level of data "1" (S30, S32). When the stored data in all the cell transistors become "1", the erasing operation is completed.

As apparent from the foregoing description, in response to the erase command, an odd erasing operation simply performs erasing of the transistor 34 while an even erasing operation is carried out in the same way as done in the prior art. On the average, therefore, the erasure time gets shorter and the power consumption becomes smaller.

Figure 12:
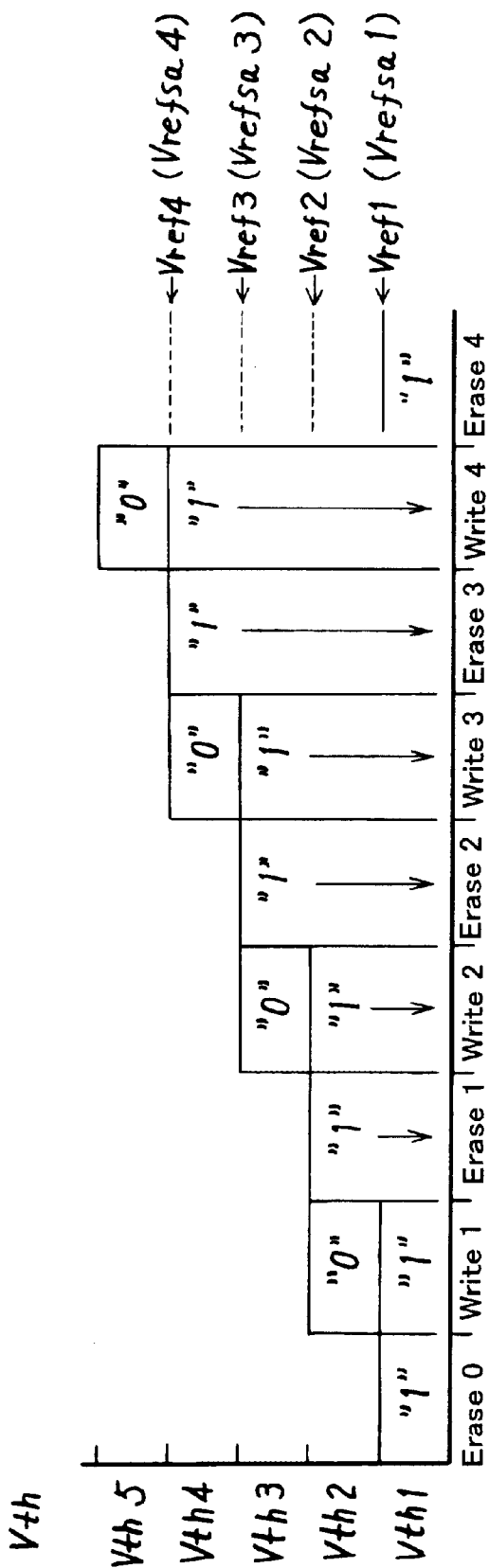
FIG. 12 is a conceptual diagram showing the operation of a memory circuit according to a second embodiment.

FIG. 12 is a conceptual diagram showing the operation of a memory circuit according to a second embodiment. Referring to FIG. 12 which corresponds to FIG. 3, the second embodiment has four recorded states whereas the first embodiment has two recorded states. Therefore, the intra-cell reference voltage Vref is set to four levels Vref1 to Vref4. According to the four levels, the reference voltages for the sense amplifier Vrefsa1 to Vrefsa4 are set and adequately and selectably switched from one to another.

In the initial erased state on the left-hand side in FIG. 12, the reference voltage is set to Vref1 and the threshold voltages of all the cell transistors are at Vth1 lower than Vref1. When writing 1 takes place, the threshold voltages of target cell transistors become Vth2 higher than the first reference voltage Vref1. Up to this point is the first recorded state in which the reference generator 30 generates the first reference voltage Vrefsa1 for the sense amplifier corresponding to the first intra-cell reference voltage Vref1.

When erasure 1 takes place next, the recorded state of the memory transistor in the reference selector 28 is changed, and the reference generator 30 outputs the second reference voltage Vrefsa2 for the sense amplifier corresponding to the second intra-cell reference voltage Vref2. Consequently, the threshold voltages Vth1 and Vth2 of all the cell transistors get lower than the reference voltage Vref2 so that those transistors are all rendered in a state of holding data "1". This erasing operation is fast and consumes less power. In writing 2, the threshold voltages of target cell transistors are changed to the third threshold voltage Vth3 which is higher than the second intra-cell reference voltage Vref2. This is the second recorded state.

In erasure 2, the reference voltage is changed to the third reference voltage Vrefsa3 for the sense amplifier. In writing 3, the threshold voltages of target cell transistors are changed to the fourth threshold voltage Vth4 which is higher than the third intra-cell reference voltage Vref3. This is the third recorded state. Erasure 3 and writing 4 are likewise carried out, and the resultant state is the fourth recorded state.

Finally, in erasure 4, as the reference voltage for the sense amplifier is at the fourth level Vrefsa4, preprogramming and full erasure are performed on the memory cell array so that the reference voltage for the sense amplifier is switched to the first level Vrefsa1.

Although the second embodiment has four recorded states, the number is any value greater than two so that three recorded states or five or more recorded states may be provided.

Figure 13:
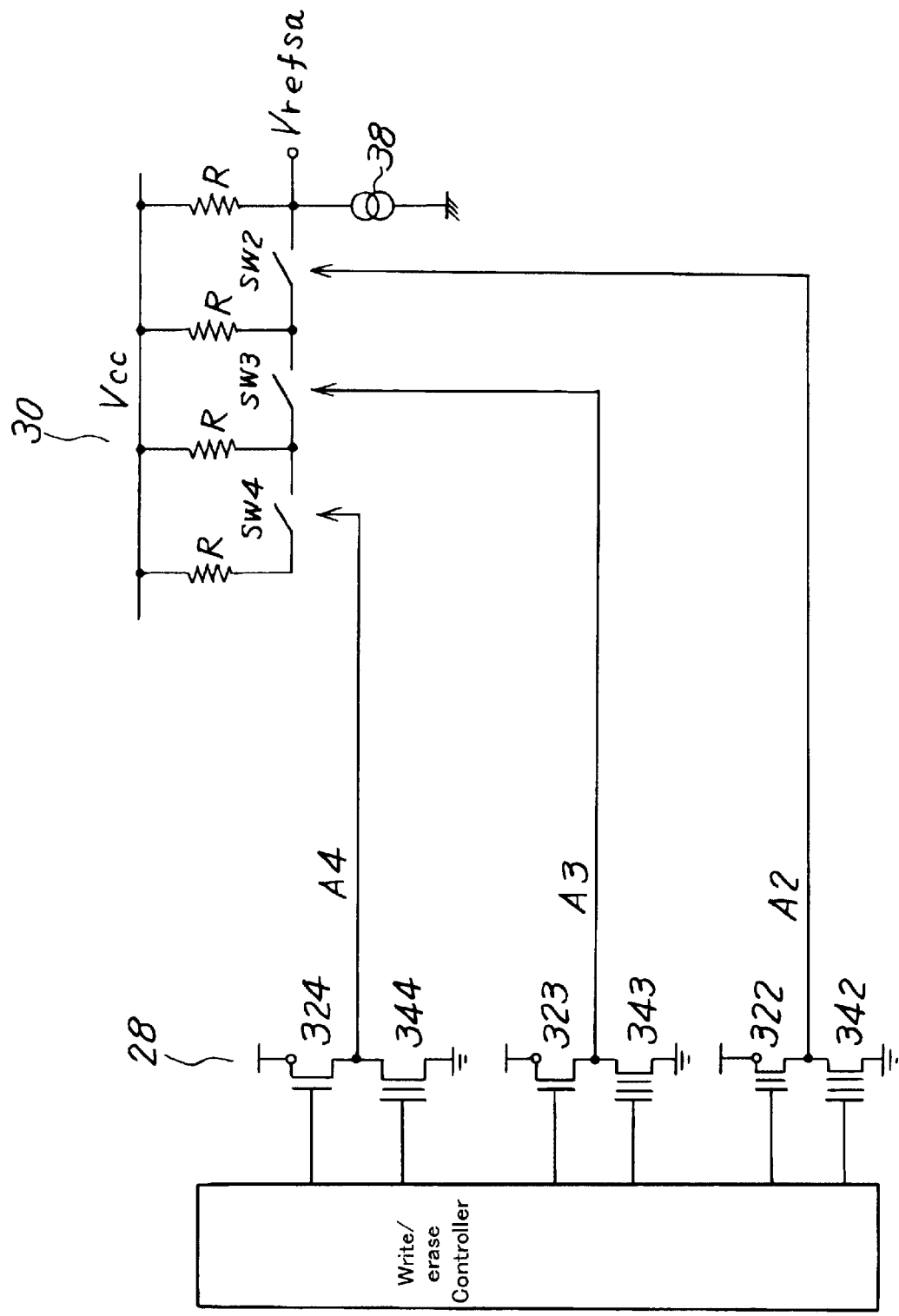
FIG. 13 is a circuit diagram depicting a reference selector and a reference generator in the second embodiment.

FIG. 13 is a circuit diagram depicting the reference selector and the reference generator in the second embodiment. Because the second embodiment has four recorded states, the reference selector 28 comprises three sets of P-channel transistors and storage transistors. Specifically, the reference selector 28 has three storage transistors 342, 343 and 344. In association with this circuit structure, the reference generator 30 has three switches SW2, SW3 and SW4 and four load resistors R connected in parallel.

In the first recorded state, the storage transistors 342, 343 and 344 are all at a low threshold voltage level, and select signals A2, A3 and A4 are all at an L level. The reference generator 30 therefore generates the first reference voltage Vrefsa1 for the sense amplifier. In the second recorded state, the threshold voltage of the storage transistor 342 becomes higher, rendering the select signals A2, A3 and A4 to have H, L and L levels respectively. Consequently, the reference generator 30 generates the second reference voltage Vrefsa2 for the sense amplifier which is higher than the first level.

In the third recorded state, the threshold voltage of the storage transistor 343 also gets higher, setting the levels of the select signals A2, A3 and A4 to H, H and L respectively. As a result, the reference generator 30 generates the third reference voltage Vrefsa3 for the sense amplifier which is higher than the second level. In the fourth recorded state, the threshold voltages of all the storage transistors 342, 343 and 344 become high, so that the levels of the select signals A2, A3 and A4 become H, H and H. Therefore, the reference generator 30 generates the fourth reference voltage Vrefsa4 for the sense amplifier which is higher than the third level. When the fourth recorded state is switched to the first one, the threshold voltages of all the storage transistors 342, 343 and 344 are set back to the original low level and the switches SW2–SW4 are all switched off, thereby generating the first reference voltage Vrefsa1 for the sense amplifier.

Figure 14:
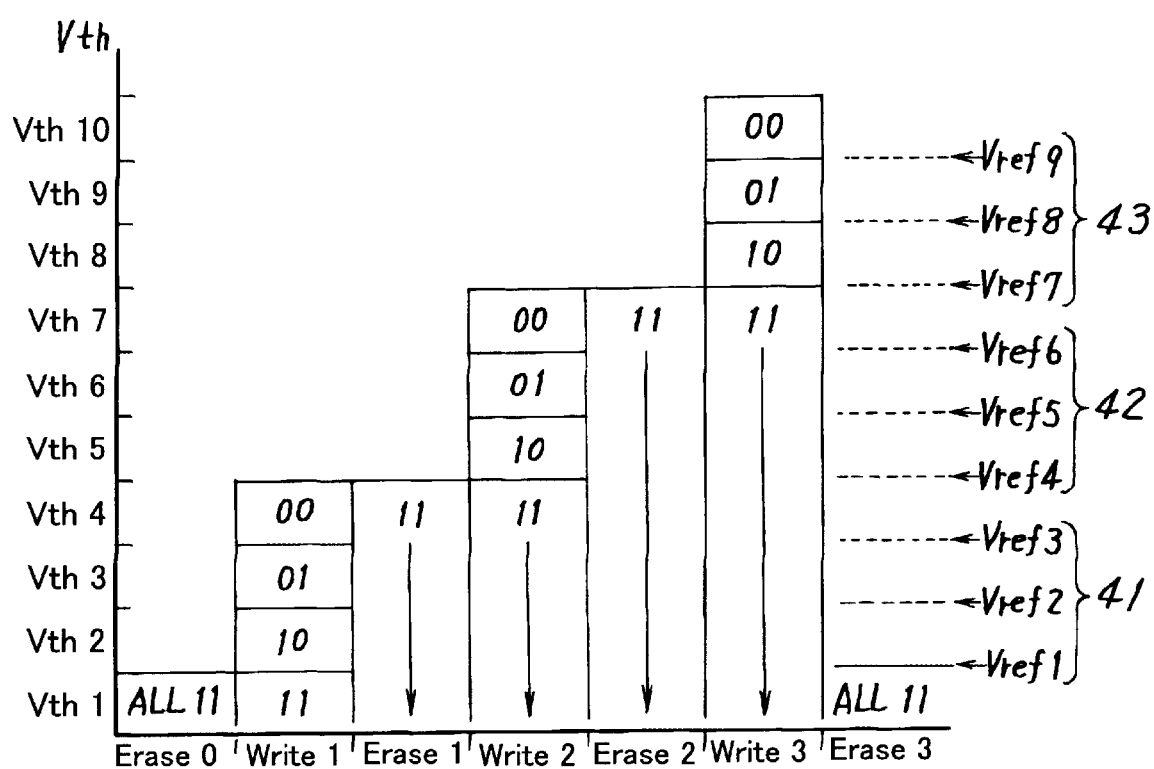
FIG. 14 is a diagram of the operational principle of a third embodiment.

FIG. 14 is a diagram of the operational principle of a third embodiment. The third embodiment is an example of adaptation of the principle of this invention to a case where multi-value data, e.g, 4-value data, is stored in each memory cell. That is, in a given recorded state, three intra-cell reference voltages Vref are set and the threshold voltage of a single cell transistor takes four states.

In that case, in erasure 0 in the initial state, the threshold voltages of all the cell transistors are at Vth1 which is lower than the minimum reference voltage Vref1 in a first group of intra-cell reference voltages 41 (Vref1, Vref2, Vref3). All of the cells therefore store data "11". In writing 1, the threshold voltages of target cell transistors are set to one of the second to fourth threshold voltages Vth2–Vth4. For the levels of the write verify operation are used the unillustrated, first group of reference voltages Vrefsa1 to Vrefsa3 for the sense amplifier which correspond to the first group of intra-cell reference voltages 41. Consequently, one of data "11", "10", "01" and "00" is stored in the cells.

In erasure 1, the reference voltage for the sense amplifier is changed to a group of reference voltages for the sense amplifier which correspond to a second group of intra-cell reference voltages 42 (Vref4–Vref6). This causes the threshold voltages of all the cell transistors to become lower than the minimum reference voltage Vref4 in the second group of intra-cell reference voltages 42 so that all the cells are in a state of data "11". In subsequent writing 2, the threshold voltages of target cell transistors are set to one of fifth to seventh threshold voltages Vth5–Vth7. For the levels of the write verify operation are used the unillustrated, second group of reference voltages Vrefsa4 to Vrefsa6 for the sense amplifier which correspond to the second group of intra-cell reference voltages 42.

In the subsequent erasure 2 and writing 3, similar operations take place. In erasures 1 and 2, therefore, an erasing operation is performed quickly and with lower power consumption. In the last erasure 3, a preprogramming operation is executed to set the threshold voltages of all the cell transistors to a level Vth10 after which a third group of reference voltages 43 is set back to the first group of reference voltages 41 to carry out full erasure.

As apparent from the above, this invention can be adapted to a case of a multi-value memory and can accomplish a fast erasing operation at lower power consumption.

Figure 15:
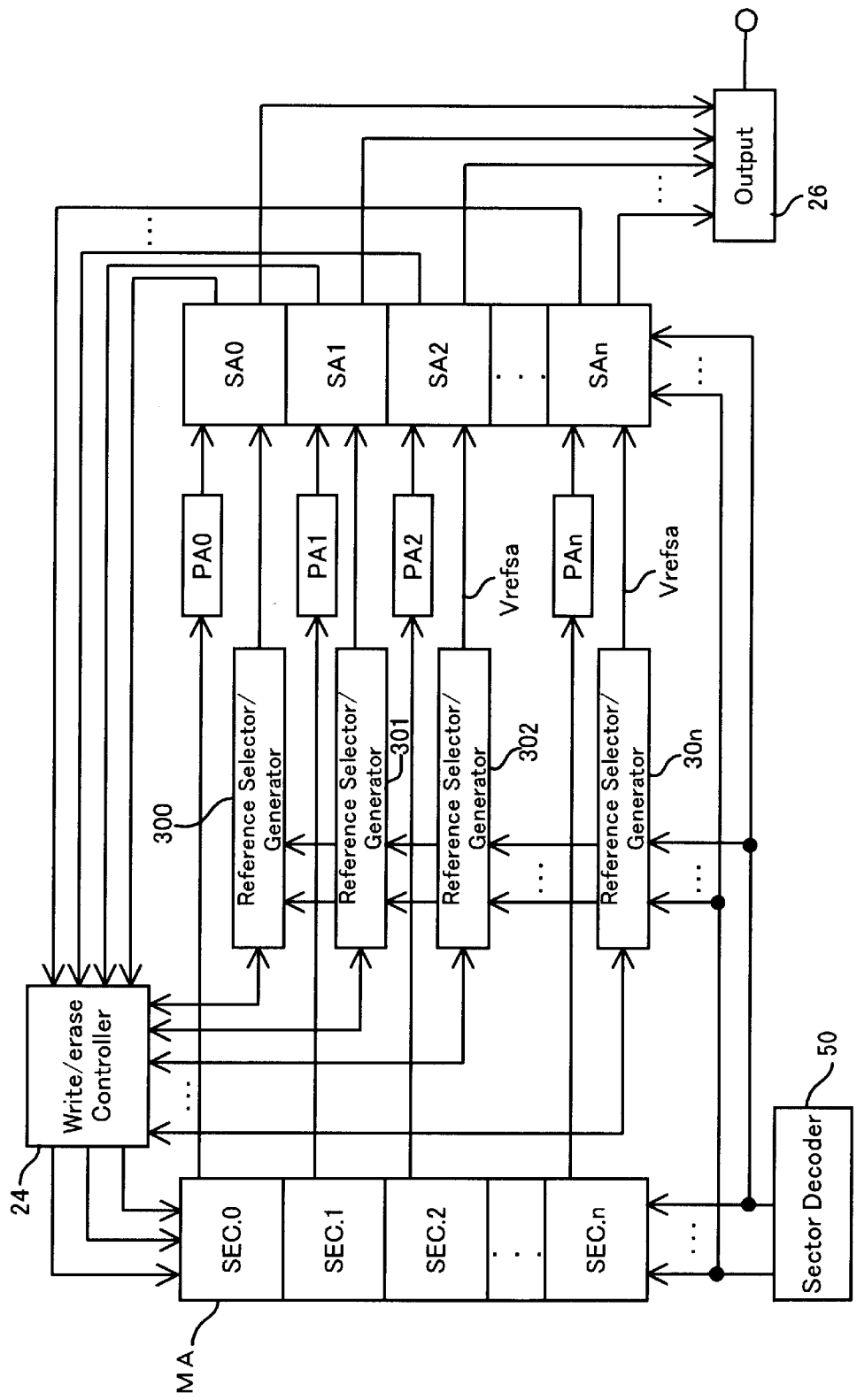
FIG. 15 is a diagram showing the structure of a memory circuit according to a fourth embodiment.

FIG. 15 is a diagram showing the structure of a memory circuit according to a fourth embodiment. In this embodiment, a memory cell array MA is separated into a plurality of sectors SEC0 to SECn and writing and erasure are performed sector by sector. A flash memory which is used as a recording medium for a digital camera performs such sector-by-sector writing and erasure.

As a result of separating the memory cell array MA into a plurality of sectors, a sector decoder 50 is provided to supply a sector select signal to the memory cell array. Further, preamplifiers PA0 to PAn, sense amplifiers SA0 to SAn and reference selectors and generators 300 to 30n are provided for the respective sectors. The sector select signal generated by the sector decoder 50 is also supplied to the sense amplifiers and the reference selectors and generators.

The preamplifiers PA0–PAn and sense amplifiers SA0–SAn are identical to those illustrated in FIG. 5. Each of the reference selectors and generators 300–30n, if designed to have a two-level structure, is identical in structure to the circuit shown in FIG. 8. Each reference selector and generator stores the recorded state of the associated sector, generates a reference voltage Vrefsa for the sense amplifier corresponding to that recorded state and supplies it to the associated one of the sense amplifiers SA0–SAn.

The write/erase controller 24 controls writing and erasing operations for the selected sector and supplies the required write voltage and erase voltage to that sector. The write/erase controller 24 also controls writing and erasing to the recording transistor in that one of the reference selectors and generators 300–30n which is associated with the selected sector. In that case, the write/erase controller 24 performs control as to whether carry out writing or erasing to the recording transistor in accordance with the recorded state of the selected sector.

The above-described second and third embodiments may be adapted to the fourth embodiment. Specifically, the fourth embodiment may be modified to provide four recorded states sector by sector or to record multi-value data sector by sector.

As apparent from the foregoing description, this invention can shorten the time needed for an erasing operation in a memory circuit having floating gates and can thus reduce the consumed power.

It should be apparent to those skilled in the art that the present invention is not limited to the details of the above-described embodiments, but is intended to embrace all alternatives, modifications and variances which fall within the scope of the appended claims.

What is claimed is:

1. A non-volatile memory circuit comprising:

a memory cell array, having non-volatile memory cells, for storing information by altering a threshold voltage of the memory cells so as to associate first and second threshold voltages respectively with first and second data values, wherein said memory cell array has a first recorded state and a second recorded state different from said first recorded state such that in said first recorded state, said first and second threshold voltages are lower or higher than a first reference voltage, and in said second recorded state, said first and second threshold voltages are lower or higher than a second reference voltage different from said first reference voltage;

a reference selector, having a non-volatile memory cell, for storing said first and second recorded states;

a reference voltage generator for generating said first or second reference voltage in accordance with said first and second recorded states stored in said reference selector; and a write and erase controller for changing the stored recorded states in the memory cell of the reference selector, wherein in said first recorded state, said first and second threshold voltages are in a voltage range lower or higher than said first reference voltage and at a time of transition to said second recorded state from said first recorded state, all of the memory cells which have been in said first recorded state become in an erased state with respect to said second reference voltage.

2. The non-volatile memory circuit according to claim 1, further having third to n-th recorded states (n being an integer equal to or greater than 3) in which third to n-th reference voltages are respectively set, and output voltages corresponding to said first and second threshold voltages in an (M−1)-th recorded state (M being an integer equal to or greater than 3) are higher or lower than an M-th reference voltage.

3. The non-volatile memory circuit according to claim 1, wherein in each of said first and second recorded states, cell transistors further have third to n-th threshold voltages (n being an integer equal to or greater than 3) to ensure recording of multiple-value data.

* * * * *